(12) United States Patent
Chang

(10) Patent No.: US 9,607,727 B2
(45) Date of Patent: Mar. 28, 2017

(54) ANISOTROPIC ELECTROCONDUCTIVE PARTICLES

(71) Applicant: SAMSUNG DISPLAY CO., LTD., Yongin, Gyeonggi-Do (KR)

(72) Inventor: Sein Chang, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/733,281

(22) Filed: Jun. 8, 2015

(65) Prior Publication Data

US 2016/0111181 A1    Apr. 21, 2016

(30) Foreign Application Priority Data

Oct. 20, 2014   (KR) .................. 10-2014-0141883

(51) Int. Cl.
*H01L 23/48*    (2006.01)
*H01L 23/52*    (2006.01)
(Continued)

(52) U.S. Cl.
CPC ............... *H01B 1/22* (2013.01); *H01L 24/17* (2013.01); *H01L 24/32* (2013.01); *H01L 24/73* (2013.01);
(Continued)

(58) Field of Classification Search
CPC ............. H01L 23/3733; H01L 23/4922; H01L 2224/83851; H01L 2224/16145; H01L 2224/16225; H01L 2224/2908; H01L 2224/29111; H01L 2224/29113; H01L 2224/29118; H01L 2224/29139; H01L 2224/29147; H01L 2224/32145; H01L 2224/32225; H01L 2224/73203; H01L 24/17; H01L 24/32; H01L 24/73; H01L 2924/01015; H01L 2924/01024; H01L 2924/01026; H01L 2924/01027; H01L 2924/01028; H01L 2924/01031; H01L 2924/01032; H01L 2924/0132; H01L 2924/06; H01L 2924/069; H01L 2924/1426; H01L 2924/2064; A63B 2071/0694; A63B 2207/02; A63B 2220/833; A63B 2225/50; A63B 2225/54; A63B 69/0048; A63B 71/0605; C23F 1/16; H01B 1/22; H05B 37/0272; H05B 37/029

(Continued)

(56) References Cited

U.S. PATENT DOCUMENTS 4,778,950 A * 10/1988 Lee ............... H01L 25/0657
                                                    174/260
5,302,456 A * 4/1994 Matsui ................. H01B 1/22
                                                    257/E21.511

(Continued)

FOREIGN PATENT DOCUMENTS

JP      2004095269      3/2004
JP      2006237484      9/2006
KR   1020080088082     10/2008

*Primary Examiner* — Teresa M Arroyo
(74) *Attorney, Agent, or Firm* — F. Chau & Associates, LLC

(57) ABSTRACT

An anisotropic electroconductive particle including a first insulating layer, a first conductive layer disposed on the first insulating layer, and a second insulating layer disposed on the first conductive layer.

14 Claims, 4 Drawing Sheets

(51) Int. Cl.
  *H01L 29/40* (2006.01)
  *H01B 1/00* (2006.01)
  *H01B 1/12* (2006.01)
  *H01B 1/22* (2006.01)
  *H01L 23/00* (2006.01)
  *H01L 23/373* (2006.01)
  *H01L 23/492* (2006.01)

(52) U.S. Cl.
  CPC ...... *H01L 23/3733* (2013.01); *H01L 23/4922* (2013.01); *H01L 2224/16145* (2013.01); *H01L 2224/16225* (2013.01); *H01L 2224/2908* (2013.01); *H01L 2224/29111* (2013.01); *H01L 2224/29113* (2013.01); *H01L 2224/29118* (2013.01); *H01L 2224/29139* (2013.01); *H01L 2224/29147* (2013.01); *H01L 2224/32145* (2013.01); *H01L 2224/32225* (2013.01); *H01L 2224/73203* (2013.01); *H01L 2924/01015* (2013.01); *H01L 2924/01024* (2013.01); *H01L 2924/01026* (2013.01); *H01L 2924/01027* (2013.01); *H01L 2924/01028* (2013.01); *H01L 2924/01031* (2013.01); *H01L 2924/0132* (2013.01); *H01L 2924/01032* (2013.01); *H01L 2924/06* (2013.01); *H01L 2924/069* (2013.01); *H01L 2924/1426* (2013.01); *H01L 2924/2064* (2013.01)

(58) Field of Classification Search
  USPC ......... 257/E23.027, E23.112, 737, 778, 780, 257/783; 252/500, 512, 514
  See application file for complete search history.

(56) References Cited

U.S. PATENT DOCUMENTS

| | | | | |
|---|---|---|---|---|
| 5,770,305 A * | 6/1998 | Terasaka | ......... | H01B 1/22 252/518.1 |
| 6,020,059 A * | 2/2000 | Yamada | ......... | C09J 7/00 428/328 |
| 6,111,628 A * | 8/2000 | Shiota | ......... | G02F 1/13452 257/E21.511 |
| 6,340,607 B1 * | 1/2002 | Yamada | ......... | H01L 21/563 257/E21.503 |
| 6,583,834 B1 * | 6/2003 | Uchiyama | ......... | G02F 1/13452 257/E21.514 |
| 6,806,581 B2 * | 10/2004 | Hsieh | ......... | H01L 24/29 257/753 |
| 9,102,851 B2 * | 8/2015 | Lee | ......... | C09J 9/02 |
| 2002/0012096 A1 * | 1/2002 | Uchiyama | ......... | G02F 1/13452 349/187 |
| 2003/0174273 A1 * | 9/2003 | Matsui | ......... | G02F 1/13452 349/151 |
| 2006/0263581 A1 * | 11/2006 | Park | ......... | H01B 1/22 428/212 |
| 2008/0160309 A1 * | 7/2008 | Kubota | ......... | C09C 1/62 428/403 |
| 2009/0075025 A1 * | 3/2009 | Ozono | ......... | H01L 24/29 428/120 |
| 2011/0110066 A1 * | 5/2011 | Yamada | ......... | C09J 7/00 361/803 |
| 2012/0104333 A1 * | 5/2012 | Takai | ......... | H05K 3/323 252/513 |
| 2014/0035128 A1 * | 2/2014 | Chou | ......... | H01L 23/585 257/737 |
| 2014/0264910 A1 * | 9/2014 | Razdan | ......... | H01L 25/0657 257/774 |
| 2015/0047878 A1 * | 2/2015 | Tamaki | ......... | C22C 5/06 174/126.2 |
| 2015/0187453 A1 * | 7/2015 | Wu | ......... | H01B 1/16 428/317.3 |
| 2015/0197672 A1 * | 7/2015 | Namiki | ......... | H01L 24/29 257/99 |
| 2015/0353781 A1 * | 12/2015 | Namiki | ......... | H01L 33/486 257/98 |
| 2016/0155717 A1 * | 6/2016 | Saruyama | ......... | H01R 4/04 428/156 |

* cited by examiner 501 502 503

ANISOTROPIC ELECTROCONDUCTIVE PARTICLES

CROSS-REFERENCE TO RELATED APPLICATION

This application claims priority under 35 U.S.C. §119 to Korean Patent Application No. 10-2014-0141883, filed on Oct. 20, 2014, in the Korean Intellectual Property Office, the disclosure of which is incorporated by reference herein in its entirety.

1. Technical Field

Exemplary embodiments of the present invention relate to conductive particles, and more particularly to anisotropic electroconductive particles.

2. Discussion of Related Art

In general, flat panel displays include a liquid crystal display (LCD), a plasma display panel (PDP), and an organic light emitting device (OLED). Flat panel displays may include an image display panel, a driving chip, and a circuit substrate. An anisotropic electroconductive film may be used to provide an electrical connection between a driving chip and electrodes of the image display panel.

A chip on glass (COG) method or a tape automated bonding method that employs a tape carrier package (TCP) may be used to mount driving chips in the image display panel. With the trend toward finer pitch electrodes in image display panels, conventional methods that employ soldering might not be preferable and an anoisotropic electroconductive film may be used.

Anisotropic electroconductive films may include an insulating resin including electroconductive particles, which may be mounted on packages through an application of heat and pressure. The anisotropic electroconductive film may provide electrical connections between electrodes in a longitudinal direction and impart insulating properties in a transverse direction. Anisotropic electroconductive materials may form an insulating layer between adjacent circuits to achieve electric insulation and may provide conductive particles between electrodes to provide connections between the electrodes in circuit substrates. However, a relatively large amount of electroconductive particles inside the insulating layer may form a bridge, thereby causing a short circuit between adjacent circuits.

SUMMARY

Exemplary embodiments of the present invention are directed to anisotropic particles configured to reduce or prevent a short circuit between adjacent circuits caused during a thermocompression bonding process of a package. Exemplary embodiments of the present invention are directed to anisotropic electroconductive materials providing electrical connections to and between electrodes.

Exemplary embodiments of the present invention are directed to anisotropic electroconductive materials including the anisotropic particles.

According to an exemplary embodiment of the present invention, an anisotropic electroconductive particle includes a first insulating layer, a first conductive layer disposed on the first insulating layer, and a second insulating layer disposed on the first conductive layer.

The anistropic electroconductive particle may have a hexahedron, a polyhedron, or a sphere shape.

The anisotropic electroconductive particle may include a second conductive layer disposed on the second insulating layer and a third insulating layer disposed on the second conductive layer.

The first to third insulating layers and the first and second conductive layers may be alternately disposed. The first and third insulating layers may be disposed on opposite sides of the anisotropic electroconductive particle.

The insulating layer and the conductive layer may have a width of about 10 μm or less.

The conductive layer may include at least one metal alloy selected from Sn—Ag-based metal alloys, Sn—Cu-based metal alloys, Sn—Bi-based metal alloys, and/or Sn—Zn-based metal alloys.

The Sn—Ag-based metal alloys, Sn—Cu-based metal alloys, Sn—Bi-based metal alloys, and Sn—Zn-based metal alloys may include at least one metal material selected from Ni, Cr, Fe, Co, Ge, P, and/or Ga.

The insulating layer may include an insulating resin including polyethylene, copolymers of polyethylene, polystyrene, copolymers of polystyrene, polymethylmethacrylate, copolymers of polymethylmethacrylate, polyvinyl chloride, copolymers of polyvinyl chloride, polycarbonate, copolymers of polycarbonate, polypropylene, copolymers of polypropylene, acrylic acid ester-based rubber, polyvinyl acetals, polyvinyl butyrals, acrylonitrile-butadiene copolymers, phenoxy resins, thermoplastic epoxy resins and/or polyurethanes.

According to an exemplary embodiment of the present invention, an anisotropic electroconductive material includes an insulating adhesive and the anisotropic electroconductive particle according to an exemplary embodiment of the present invention. The anisotropic electroconductive particle may be dispersed in the insulating adhesive.

The insulating adhesive may be selected from vinyl acetate resins, vinyl chloride resins, acrylic resins, styrene-based resins, polyolefin-based resins, ethylene-vinyl acetate copolymers, polyamide-based resins, epoxy-based resins, urethane-based resins, acrylic resins, polyimide-based resins, unsaturated polyester-based resins, styrene-butadiene-styrene block copolymers, styrene-isoprene-styrene block copolymers, styrene-butadiene copolymer rubber, chloroprene rubber and/or acrylonitrile-styrene block copolymer rubber.

The anisotropic electroconductive material may include an anisotropic electroconductive film, an anisotropic electroconductive sheet, an anisotropic electroconductive pressure-sensitive adhesive, an anisotropic electroconductive ink, and/or an anisotropic electroconductive paste.

According to exemplary embodiments of the present invention, anisotropic particles may reduce or prevent an occurrence of a short circuit between adjacent circuits caused during a thermocompression bonding process of a package and anisotropic electroconductive materials. The anisotropic electroconductive materials may provide electrical connections to and between electrodes.

According to an exemplary embodiment of the present invention, a circuit connection structure includes a display panel, at least one electrode disposed on the display panel, a driving chip disposed opposite the display panel, at least one bump disposed on the driving chip and an anisotropic electroconductive material disposed between the display panel and the driving chip. The at least one bump faces the at least one electrode. The anisotropic electroconductive material includes an insulating adhesive and a plurality of anisotropic conductive particles dispersed in the insulating adhesive. The anisotropic conductive particles each include a first insulating layer, a first conductive layer disposed on the first insulating layer, and a second insulating layer disposed on the first conductive layer.

Each of the anisotropic electroconductive particles has a hexahedron, a polyhedron, or a sphere shape.

Each of the anisotropic electroconductive particles further comprises a second conductive layer disposed on the second insulating layer, and a third insulating layer disposed on the second conductive layer.

The first to third insulating layers and the first and second conductive layers are alternately disposed, and wherein the first and third insulating layers are disposed on opposite sides of the anisotropic electroconductive particle.

The insulating layer and the conductive layer have a width of about 10 μm or less.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Figure 1:
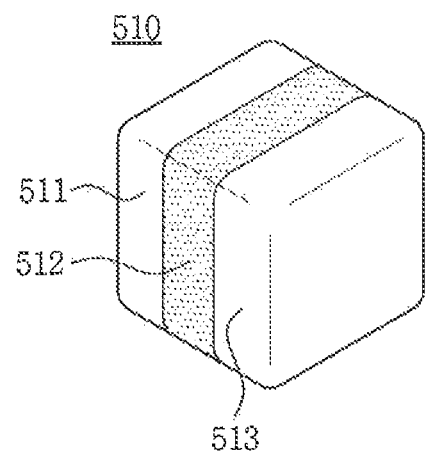
FIG. 1 is a perspective view illustrating an anisotropic electroconductive particle according to an exemplary embodiment of the present invention.

Hereinafter, exemplary embodiments of the present invention will be described in more detail with reference to the accompanying drawings. The present invention may, however, be embodied in many different forms and should not be construed as being limited to the embodiments set forth herein. Like reference numerals may refer to like elements throughout the specification and drawings.

The spatially relative terms "below", "beneath", "lower", "above", "upper", and the like, may be used herein to describe the relationship between an element or component and another element or component as illustrated in the drawings. It will be understood that the spatially relative terms may encompass different orientations of the device in use or operation, in addition to the orientation depicted in the drawings. The device may also be oriented in the other direction, and thus the spatially relative terms may be interpreted differently depending on the orientations.

The terms and names used herein may be used to describe exemplary embodiments of the present invention and may be modified as desired.

Terms and names of elements used herein may differ from the actual names of products.

According to an exemplary embodiment of the present invention, an anisotropic electroconductive particle may include a first insulating layer, a first conductive layer disposed on the first insulating layer; and a second insulating layer disposed on the first conductive layer.

According to an exemplary embodiment of the present invention, an anisotropic electroconductive material may include an insulating adhesive and the anisotropic electroconductive particles dispersed in the insulating adhesive.

Hereinafter, an anisotropic electroconductive particle according to an exemplary embodiment of the present invention will be described in more detail with reference to FIGS. 1 to 3.

FIG. 1 is a perspective view illustrating an anisotropic electroconductive particle 510 according to an exemplary embodiment of the present invention. FIG. 2 is a perspective view illustrating a plate-type structure in which an insulating layer and a conductive layer are alternatively disposed. FIG. 3 is a cross-sectional view illustrating one surface of an anisotropic electroconductive particle according to an exemplary embodiment of the present invention.

Figure 2:
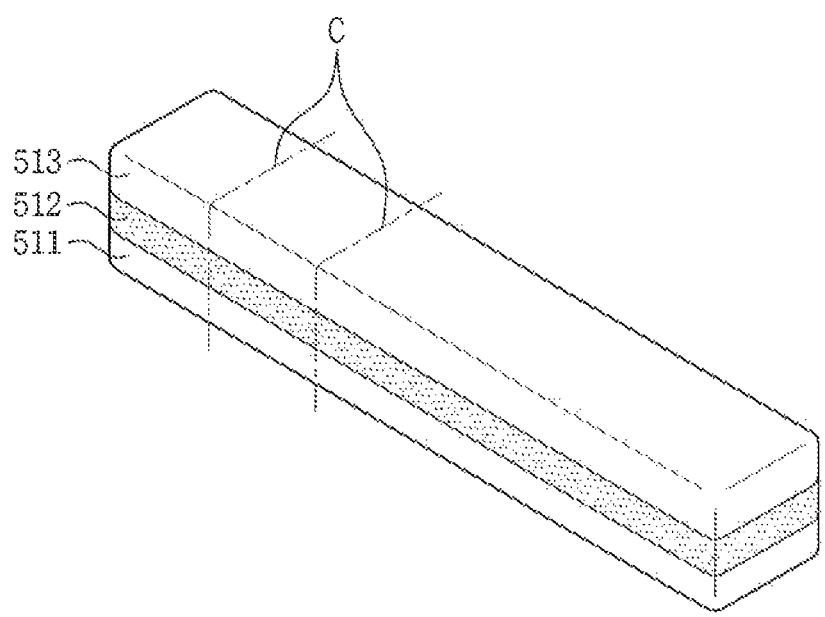
FIG. 2 is a perspective view illustrating a plate-type structure in which an insulating layer and a conductive layer are alternatively disposed.
Figure 3:
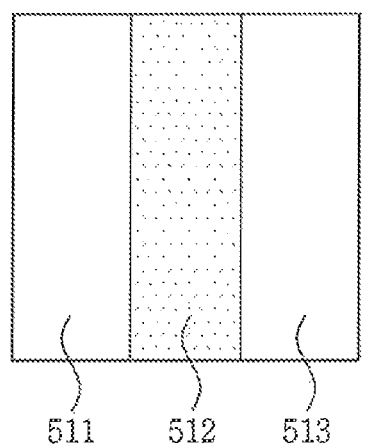
FIG. 3 is a cross-sectional view illustrating one surface of an anisotropic electroconductive particle according to an exemplary embodiment of the present invention.

Referring to FIGS. 1 to 3, an anisotropic electroconductive particle 510 according to an exemplary embodiment of the present invention may include a first insulating layer 511, a first conductive layer 512 disposed on the first insulating layer 511, and a second insulating layer 513 disposed on the first conductive layer 512.

The anisotropic electroconductive particle 510 may have, for example, a hexahedron, a polyhedron, or a sphere shape.

The anisotropic electroconductive particle 510 may have a width in a range of from about micrometers (μm) to about tens of micrometers (μm) in accordance with a structure of a package having an electrical connection.

The anisotropic electroconductive particle 510 according to an exemplary embodiment of the present invention may have a width from about 1 to about 10 μm. The anisotropic electroconductive particle 510 may have a side length, a diameter, or a major axis having a width in a range of from about 1 to about 10 μm. When the anisotropic electroconductive particle 510 has a width greater than about 10 μm, a micro-conduction path need not be formed within the anisotropic electroconductive material disposed between electrical devices. When the anisotropic electroconductive particle 510 has a width less than 1 μm in size, the anisotropic electroconductive material may include a plurality of anisotropic electroconductive particles.

The insulating layers 511 and 513 and the conductive layer 512 may be alternately disposed.

The number of insulating layers (e.g., the first and second insulating layers 511 and 513) and conductive layers (e.g., the first conductive layer 512) is not limited to those illustrated in FIGS. 1 to 3. The insulating layers (e.g., the first and second insulating layers 511 and 513) may be disposed at the top and the bottom of the anisotropic electroconductive particle 510, and the insulating layers may reduce or prevent an occurrence of a short circuit caused by maldistribution of the electroconductive particles between electric circuit devices.

Referring to FIG. 2, the first insulating layer 511, the first conductive layer 512, and the second insulating layer 513 may be sequentially formed and cut along a cutting line C to form the anisotropic electroconductive particle 510.

The insulating layers 511 and 513 and the conductive layer 512 may be alternately disposed with the first insulating layer 511 at the bottom and the second insulating layer 513 at the top of the electroconductive particle 510 to form a plate-type structure. The insulating layers 511 and 513 and the conductive layer 512 may be cut along the cutting line C to have a width of about 10 µm or less to form the anisotropic electroconductive particle 510.

As illustrated in FIGS. 1 and 2, the anisotropic electroconductive particles 510 may each have smoothly curved sides, but exemplary embodiments of the present invention are not limited thereto.

The first and second insulating layers 511 and 513 may include at least one insulating resin. The insulating resin may include polyethylene, copolymers of polyethylene, polystyrene, copolymers of polystyrene, polymethylmethacrylate, copolymers of polymethylmethacrylate, polyvinyl chloride, copolymers of polyvinyl chloride, polycarbonate, copolymers of polycarbonate, polypropylene, copolymers of polypropylene, acrylic acid ester-based rubber, polyvinyl acetals, polyvinyl butyrals, acrylonitrile-butadiene copolymers, phenoxy resins, thermoplastic epoxy resins and/or polyurethanes.

The conductive layer 512 may include at least one metal alloy. The metal alloy may include Sn—Ag-based metal alloys, Sn—Cu-based metal alloys, Sn—Bi-based metal alloys, and Sn—Zn-based metal alloys. Each of the metal alloys may include metal materials of Ni, Cr, Fe, Co, Ge, P, and Ga, other than Sn and Ag, Sn and Cu, Sn and Bi, and/or Sn and Zn.

Figure 4:
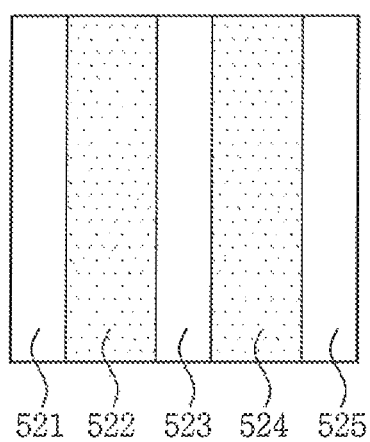
FIG. 4 is a cross-sectional view illustrating one surface of an anisotropic electroconductive particle according to an exemplary embodiment of the present invention.

FIG. 4 is a cross-sectional view illustrating one surface of an anisotropic electroconductive particle according to an exemplary embodiment of the present invention.

Referring to FIG. 4, an anisotropic electroconductive particle 520 according to an exemplary embodiment of the present invention may include a first insulating layer 521, a first conductive layer 522 disposed on the first insulating layer 521, a second insulating layer 523 disposed on the first conductive layer 522, a second conductive layer 524 disposed on the second insulating layer 523, and a third insulating layer 525 disposed on the second conductive layer 524.

The anisotropic electroconductive particle 520 according to an exemplary embodiment of the present invention may include the second conductive layer 524 and the third insulating layer 525. In the anisotropic electroconductive particle 520 according to an exemplary embodiment of the present invention, the first, second and third insulating layers 521, 523 and 525 and the first and second conductive layers 522 and 524 may include the same material as that of the exemplary embodiment of the present invention described with reference to FIGS. 1 to 3. The first, second and third insulating layers 521, 523 and 525 may be disposed on the top and the bottom of the anisotropic electroconductive particles 520. The first, second and third insulating layers 521, 523 and 525 may prevent a short circuit caused by maldistribution of the anisotropic electroconductive particles 520.

Figure 5:
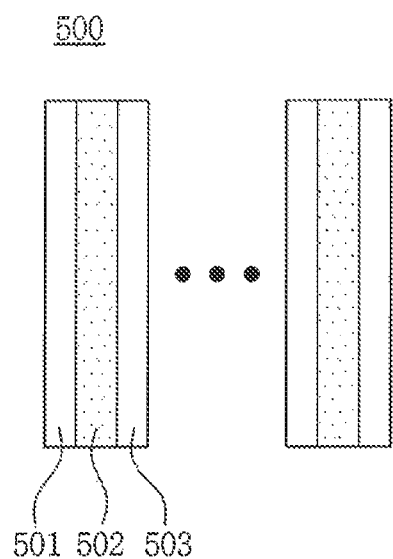
FIG. 5 is a cross-sectional view illustrating one surface of an anisotropic electroconductive particle according to an exemplary embodiment of the present invention.

FIG. 5 is a cross-sectional view illustrating one surface of an anisotropic electroconductive particle according to an exemplary embodiment of the present invention.

Referring to FIG. 5, an anisotropic electroconductive particle 500 according to an exemplary embodiment of the present invention may include insulating layers 501 and 503 and a conductive layer 502. The insulating layers 501 and 503 and the conductive layer 502 may be alternately and repeatedly stacked. The number of insulating layers 501 and 503 and conductive layer 502 may be determined as desired, and exemplary embodiments of the present invention are not limited to a particular number of insulating layers 501 and 503 and conductive layer 502. However, as described above, the insulating layers (e.g., insulating layers 501 and 503) may be disposed on the top and the bottom of the anisotropic electroconductive particle 500, and the insulating layers may reduce or prevent an occurrence of a short circuit caused by maldistribution of the anisotropic electroconductive particles 520 between electrical circuit devices.

In the anisotropic electroconductive particle 500 according to an exemplary embodiment of the present invention, the insulating layers 501 and 503 and the conductive layer 502 may include the same material as that of the exemplary embodiment of the present invention described with reference to FIGS. 1 to 3.

An exemplary embodiment of the present invention may provide an anisotropic electroconductive material including the anisotropic electroconductive particles according to the above-described exemplary embodiments disposed in an insulating adhesive.

Figure 6:
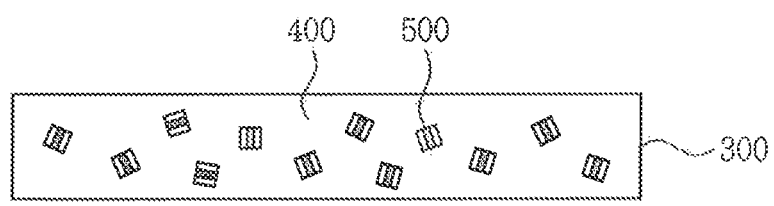
FIG. 6 is a cross-sectional view illustrating an anisotropic electroconductive material including an anisotropic electroconductive particle according to an exemplary embodiment of the present invention.

FIG. 6 is a cross-sectional view illustrating the anisotropic electroconductive material including an anisotropic electroconductive particle according to an exemplary embodiment of the present invention.

As illustrated in FIG. 6, an anisotropic electroconductive material 300 may include an insulating adhesive 400 and the anisotropic electroconductive particle 500 dispersed in the insulating adhesive 400.

The insulating adhesive 400 may include at least one of vinyl acetate resins, vinyl chloride resins, acrylic resins, styrene-based resins, polyolefin-based resins, ethylene-vinyl acetate copolymers, polyamide-based resins, epoxy-based resins, urethane-based resins, acrylic resins, polyimide-based resins, unsaturated polyester-based resins, styrene-butadiene-styrene block copolymers, styrene-isoprene-styrene block copolymers, styrene-butadiene copolymer rubber, chloroprene rubber and/or acrylonitrile-styrene block copolymer rubber.

The form of the anisotropic electroconductive material 300 is not particularly limited and may include, for example, an anisotropic electroconductive film, an anisotropic electroconductive sheet, an anisotropic electroconductive pressure-sensitive adhesive, an anisotropic electroconductive ink, and/or an anisotropic electroconductive paste.

Figure 7:
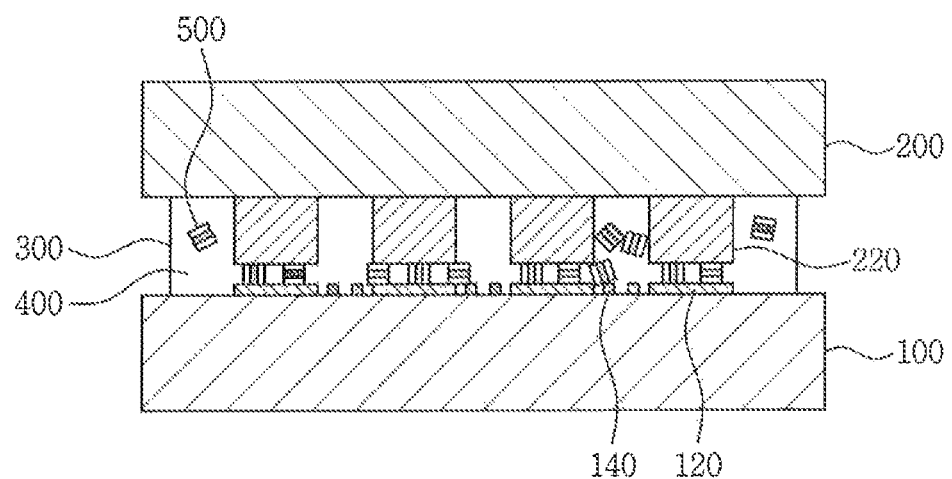
FIG. 7 is a schematic view illustrating a circuit connection structure electrically connected by the anisotropic electroconductive material of FIG. 6.

FIG. 7 is a schematic view illustrating a circuit connection structure electrically connected by the anisotropic electroconductive material illustrated in FIG. 6.

To electrically connect fine circuits using the anisotropic electroconductive material 300, the anisotropic electroconductive material 300 including the insulating adhesive 400 and the plurality of anisotropic electroconductive particles 500 dispersed in the insulating adhesive 400 may be disposed between a bump 220 and an electrode 120. The bump 220 and the electrode 120 may respectively face a bottom surface of a driving chip 200 and an upper surface of a display panel 100. A thermocompression bonding process may be performed at a predetermined temperature and pressure, as illustrated in FIG. 7, and thus the anisotropic electroconductive particles 500 disposed between the bump 220 and the electrode 120 may electrically connect the bump 220 and the electrode 120.

The bump 220 and the electrode 120 may face each other and may be electrically connected through a conductive layer (e.g., the conductive layer 502) of the anisotropic electroconductive particle 500. The occurrence of a short circuit between the bump 220 and a conductive line 140, between the bump 220, the electrode 120, and the conductive line 140, and/or between the bumps 220 in the connecting process may be reduced or prevented by the one or more insulating layers (e.g. the insulating layers 501 and 503) of the anisotropic electroconductive particle 500.

According to exemplary embodiments of the present invention, anisotropic electroconductive particles and anisotropic electroconductive materials including the anisotropic electroconductive particles may reduce or prevent an occurrence of a short circuit between adjacent circuits when electrically connecting fine circuits and may provide an active electrical connection between electrodes.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An anisotropic electroconductive material comprising:
   an insulating adhesive; and
   a plurality of anisotropic electroconductive particles dispersed in the insulating adhesive, wherein each of the anisotropic electroconductive particles comprises:
   a first insulating layer;
   a first conductive layer disposed on the first insulating layer; and
   a second insulating layer disposed on the first conductive layer.

2. The anisotropic electroconductive material of claim 1, wherein each of the anisotropic electroconductive particles has a polyhedron shape.

3. The anisotropic electroconductive material of claim 1, further comprising:
   a second conductive layer disposed on the second insulating layer; and
   a third insulating layer disposed on the second conductive layer.

4. The anisotropic electroconductive material of claim 1, wherein the first and second insulating layers are disposed on opposite sides of the anisotropic electroconductive particle.

5. The anisotropic electroconductive material of claim 1, wherein the first insulating layer and the first conductive layer have a width of about 10 μm or less.

6. The anisotropic electroconductive material of claim 1, wherein the first conductive layer comprises at least one metal alloy selected from Sn—Ag-based metal alloys, Sn—Cu-based metal alloys, Sn—Bi-based metal alloys, and/or Sn—Zn-based metal alloys.

7. The anisotropic electroconductive material of claim 6, wherein the Sn—Ag-based metal alloys, Sn—Cu-based metal alloys, Sn—Bi-based metal alloys, and Sn—Zn-based metal alloys further comprise at least one metal material selected from Ni, Cr, Fe, Co, Ge, P, and/or Ga.

8. The anisotropic electroconductive material of claim 1, wherein the first insulating layer comprises an insulating resin including at least one of polyethylene, copolymers of polyethylene, polystyrene, copolymers of polystyrene, polymethylmethacrylate, copolymers of polymethylmethacrylate, polyvinyl chloride, copolymers of polyvinyl chloride, polycarbonate, copolymers of polycarbonate, polypropylene, copolymers of polypropylene, acrylic acid ester-based rubber, polyvinyl acetals, polyvinyl butyrals, acrylonitrile-butadiene copolymers, phenoxy resins, thermoplastic epoxy resins or polyurethanes.

9. A circuit connection structure comprising:
   a display panel;
   at least one electrode disposed on the display panel;
   a driving chip disposed opposite the display panel;
   at least one bump disposed on the driving chip, wherein the at least one bump faces the at least one electrode; and
   an anisotropic electroconductive material disposed between the display panel and the driving chip, wherein the anisotropic electroconductive material includes an insulating adhesive and a plurality of anisotropic conductive particles dispersed in the insulating adhesive, and wherein the anisotropic conductive particles each include a first insulating layer, a first conductive layer disposed on the first insulating layer, and a second insulating layer disposed on the first conductive layer.

10. The circuit connection structure of claim 9, wherein each of the anisotropic electroconductive particles has a polyhedron shape.

11. The circuit connection structure of claim 9, wherein each of the anisotropic electroconductive particles further comprises a second conductive layer disposed on the second insulating layer, and a third insulating layer disposed on the second conductive layer.

12. The circuit connection structure of claim 9, wherein the first and second insulating layers and the first conductive layer are alternately disposed, and wherein the first and second insulating layers are disposed on opposite sides of the anisotropic electroconductive particle.

13. The circuit connection structure of claim 9, wherein the first insulating layer and the first conductive layer have a width of about 10 μm or less.

14. The anisotropic electroconductive material of claim 1, wherein each of the plurality of anisotropic electroconductive particles is narrower than a thickness of the insulating adhesive.

* * * * *